United States Patent
Jun et al.

(10) Patent No.: US 10,938,408 B2
(45) Date of Patent: Mar. 2, 2021

(54) SEMICONDUCTOR DEVICE FOR READING AND OUTPUTTING SIGNAL FROM A SENSOR

(71) Applicant: Seoul National University R&DB Foundation, Seoul (KR)

(72) Inventors: Jaehoon Jun, Seoul (KR); Cyuyeol Rhee, Cheongju-si (KR); Suhwan Kim, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/858,330

(22) Filed: Apr. 24, 2020

(65) Prior Publication Data
US 2020/0259503 A1  Aug. 13, 2020

Related U.S. Application Data

(63) Continuation of application No. PCT/KR2018/012615, filed on Oct. 24, 2018.

(30) Foreign Application Priority Data

Oct. 26, 2017  (KR) .......................... 10-2017-0140492

(51) Int. Cl.
*H03M 3/00* (2006.01)
*H03F 3/45* (2006.01)

(52) U.S. Cl.
CPC ........ *H03M 3/464* (2013.01); *H03F 3/45475* (2013.01); *H03M 3/34* (2013.01);
(Continued)

(58) Field of Classification Search
CPC ........ H03M 3/464; H03M 3/34; H03M 3/496; H03M 3/504; H03M 3/322; H03M 1/12;
(Continued)

(56) References Cited

U.S. PATENT DOCUMENTS 4,939,516 A * 7/1990 Early .................. H03F 1/304
327/124
5,039,989 A * 8/1991 Welland .................. H03M 3/34
341/118
(Continued)

FOREIGN PATENT DOCUMENTS

EP  2955492 B1  5/2017
KR  101154240 B1  6/2012
(Continued)

OTHER PUBLICATIONS

Alberto Rodríguez-Pérez et al., "A 515 nW, 0-18 dB Programmable Gain Analog-to-Digital Converter for In-Channel Neural Recording Interfaces", IEEE Transactions on Biomedical Circuits and Systems, vol. 8, No. 3, Jun. 2014, pp. 358-370.
(Continued)

*Primary Examiner* — Jean B Jeanglaude
(74) *Attorney, Agent, or Firm* — William Park & Associates Ltd.

(57) ABSTRACT

A semiconductor device includes a signal input circuit configured to select one of the plurality of differential sensor signals according to a channel selection signal; an amplifier circuit configured to amplify an output of the signal input circuit; and an analog-to-digital converter (ADC) configured to convert an output of the amplifier circuit into a digital value, wherein each of the plurality of sensor signals is a differential signals and the signal input circuit changes polarity of an output signal thereof according to a first chopping signal, and wherein the ADC includes a delta-sigma modulator configured to generate a bit stream from an output of the amplifier circuit; an output chopping circuit configured to adjust phase of the bit stream according to the first chopping signal; and a filter configured to filter an
(Continued)

output of the output chopping circuit and to output the digital value.

15 Claims, 8 Drawing Sheets

(52) U.S. Cl.
CPC ........... *H03M 3/496* (2013.01); *H03M 3/504* (2013.01); *H03F 2200/331* (2013.01)

(58) Field of Classification Search
CPC ................. H03M 3/30; H03F 3/45475; H03F 2200/331; H03F 3/005
USPC .................................................. 341/143, 155
See application file for complete search history.

(56) References Cited

U.S. PATENT DOCUMENTS

| | | | | |
|---|---|---|---|---|
| 6,411,242 | B1* | 6/2002 | Oprescu | H03M 1/0663 341/143 |
| 7,551,110 | B1* | 6/2009 | Tsyrganovich | H03M 3/34 329/307 |
| 7,714,757 | B2* | 5/2010 | Denison | A61B 5/04012 341/143 |
| 10,148,237 | B2* | 12/2018 | Raman | G01D 5/142 |
| 10,481,219 | B2* | 11/2019 | Romero | H03F 3/387 |
| 2005/0275575 | A1* | 12/2005 | Motz | H03M 3/356 341/143 |
| 2010/0103014 | A1* | 4/2010 | Quiquempoix | H03M 3/34 341/143 |
| 2010/0289682 | A1 | 11/2010 | Groenewold | |
| 2018/0247522 | A1* | 8/2018 | Motz | H03M 1/1071 |

FOREIGN PATENT DOCUMENTS

| | | |
|---|---|---|
| KR | 1020120065369 A | 6/2012 |
| KR | 1020120083926 A | 7/2012 |
| KR | 1020130142952 A | 12/2013 |
| KR | 101579391 B1 | 12/2015 |
| KR | 1020170015712 A | 2/2017 |
| KR | 101766134 B1 | 8/2017 |

OTHER PUBLICATIONS

Andreas C. Fischer et al., "Integrating MEMS and ICs", Microsystems &Nanoengineering (2015), npg, pp. 1-16, Department of Micro and Nanosystems, School of Electrical Engineering, KTH Royal Institute of Technology, SE-10044 Stockholm, Sweden.
Anton Bakker et al., "High-Accuracy CMOS Smart Temperature Sensors", pp. 1-3, 1.2, Springer Science +Business Media Dordrecht 2000.
Babak Vakili Amini et al., "A 2.5V 14-bit ΣΔ CMOS-SOI Capacitive Accelerometer", ISSCC 2004 / Session 17 / MEMS and Sensors / 17.3, Feb. 18, 2004.
Behzad Razavi, "Principles of Data Conversion System Design", 1995, IEEE Press, New York, NY, USA.
Christian C. Enz et al., "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, pp. 1584-1614.
Daniel De Dorigo et al., "Q-Enhancement of a Low-Power gm-C Bandpass Filter for Closed-Loop Sensor Readout Applications", 2015 IEEE International Symposium on Circuits and Systems (ISCAS), May 24-27, 2015, pp. 678-681, Lisbon, Portugal.
Eduard Säckinger, "Broadband Circuits for Optical Fiber Communication", TIA Circuit Concepts, Jan. 27, 2005, p. 139, Wiley Interscience, John Wiley & Sons, Inc., USA.
Eugene G. Hogenauer, "An Economical Class of Digital Filters for Decimation and Interpolation", IEEE Transactions on Acoustics, Speech, and Signal Processing, vol. ASSP-29, No. 2, Apr. 1981, pp. 155-162.

Fengtian Han et al., "A sensitive three-axis micromachined accelerometer based on an electrostatically suspended proof mass", Sensors, 2013 IEEE, Nov. 3-6, 2013, Baltimore, MD, USA.
Haluk Külah et al., "Noise Analysis and Characterization of a Sigma-Delta Capacitive Microaccelerometer", IEEE Journal of Solid-State Circuits, vol. 41, No. 2, Feb. 2006, pp. 352-361.
Hui Jiang et al., "An Energy-Efficient 3.7nV/√Hz Bridge-Readout IC with a Stable Bridge Offset Compensation Scheme", ISSCC 2017 / Session 9 / Sensors / 9.8, Feb. 7, 2017, pp. 172-174.
Jaehoon Jun et al., "A 386-µW, 15.2-bit Programmable-Gain Embedded Delta-Sigma ADC for Sensor Applications", ISLPED '16, Proceedings of the 2016 International Symposium on Low Power Electronics and Design, Aug. 8-10, 2016.
Jaehoon Jun et al., "An SC Interface With Programmable-Gain Embedded ΔΣ ADC for Monolithic Three-Axis 3-D Stacked Capacitive MEMS Accelerometer", IEEE Sensors Journal, vol. 17, No. 17, Sep. 1, 2017, pp. 5558-5568.
Kelvin Yi-Tse Lai et al., "A 0.0354mm2 82µW 125KS/s 3-Axis Readout Circuit for Capacitive MEMS Accelerometer", 2013 IEEE Asian Solid-State Circuits Conference (A-SSCC), Nov. 11-13, 2013, pp. 109-112, IEEE, Singapore, Singapore.
Mark Lemkin et al., "A Micromachined Fully Differential Lateral Accelerometer", IEEE 1996 Custom Integrated Circuits Conference, May 5-8, 1996, pp. 315-318, San Diego, CA, USA.
Mark Lemkin et al., "A Three-Axis Micromachined Accelerometer with a CMOS Position-Sense Interface and Digital Offset-Trim Electronics", IEEE Journal of Solid-State Circuits, vol. 34, No. 4, Apr. 1999, pp. 456-468.
Masahiko Maruyama et al., "An Analog Front-End for a Multifunction Sensor Employing a Weak-Inversion Biasing Technique With 26 nVrms, 25 aCrms, and 19 fArms Input-Referred Noise", IEEE Journal of Solid-State Circuits, vol. 51, No. 10, Oct. 2016, pp. 2252-2261.
Matthia Steiner et al., "A 22.3b 1kHz 12.7mW Switched-Capacitor ΔΣ Modulator with Stacked Split-Steering Amplifiers", ISSCC 2016 / Session 15 / Oversampling Data Converters / 15.8, Feb. 2, 2016, pp. 284-286.
Mika Kämäräinen et al., "A 1.5µW 1V 2nd-Order ΔΣ Sensor Front-End with Signal Boosting and Offset Compensation for a Capacitive 3-Axis Micro-Accelerometer", Digest of Technical Papers, Feb. 3-7, 2008, pp. 578-637, ISSCC 2008, Session 32, MEMS & Sensors, 32.2.
Mikail Yucetas et al., "A Closed-Loop SC Interface for a ±1.4g Accelerometer with 0.33% Nonlinearity and 2µg/√Hz Input Noise Density", Digest of Technical Papers, ISSCC 2010 / Session 17 / Sensors & MEMS / 17.7, Feb. 9, 2010, pp. 320-323.
Navid Yazdi et al., "Micromachined Inertial Sensors", Proceedings of the IEEE, Aug. 1998, pp. 1640-1659, vol. 86, No. 8.
Pedram Lajevardi et al., "A ΔΣ Interface for MEMS Accelerometers Using Electrostatic Spring Constant Modulation for Cancellation of Bondwire Capacitance Drift", IEEE Journal of Solid-State Circuits, vol. 48, No. 1, Jan. 2013, pp. 265-275.
Po-Chang Wu et al., "Digital Offset Trimming Techniques for CMOS MEMS Accelerometers", IEEE Sensors Journal, vol. 14, No. 2, Feb. 2014, pp. 570-577.
R. Jacob Baker et al., "CMOS Circuit Design, Layout, and Simulation", IEEE Press Series on Microelectronic Systems, Part III CMOS Analog Circuits, Chapter 25 Operational Amplifiers, 1998, pp. 642-644, IEEE Press, New York, USA.
Reha Kepenek et al., "A µg Resolution Microaccelerometer System with a Second-Order Σ-Δ Readout Circuitry", 2014 IEEE/ION Position, Location and Navigation Symposium—PLANS 2014, May 5-8, 2014, pp. 41-44, IEEE, Monterey, CA, USA.
Richard Schreier et al., "Design-Oriented Estimation of Thermal Noise in Switched-Capacitor Circuits", IEEE Transactions on Circuits and Systems-I: Regular Papers, vol. 52, No. 11, Nov. 2005, pp. 2358-2368.
Richard Schreier et al., "Understanding Delta-Sigma Data Converters", IEEE Press, Wiley Interscience, John Wiley & Sons, Inc., 2005, pp. 286-387, USA.
Rong Wu et al., "A 20-b±40-mV Range Read-Out IC With 50-nV Offset and 0.04% Gain Error for Bridge Transducers", IEEE Journal of Solid-State Circuits, vol. 47, No. 9, Sep. 2012, pp. 2152-2163.

(56) References Cited

OTHER PUBLICATIONS

Rong Wu et al., "A 21b±40mV Range Read-Out IC for Bridge Transducers", ISSCC 2011 / Session 6 / Sensors & Energy Harvesting / 6.4, Feb. 21, 2011, pp. 110-112.

Saber Amini et al., "A Flexible Charge-Balanced Ratiometric Open-Loop Readout System for Capacitive Inertial Sensors", IEEE Transactions on Circuits and Systems-II: Express Briefs, vol. 62, No. 4, Apr. 2015, pp. 317-321.

Sheng-Hsiang Tseng et al., "Implementation of a monolithic capacitive accelerometer in a wafer-level 0.18 μm CMOS MEMS process", Journal of Micromechanics and Microengineering, Apr. 13, 2012, pp. 1-14, IOP Publishing.

Shiwei Wang et al., "A Power-Efficient Capacitive Read-Out Circuit With Parasitic-Cancellation for MEMS Cochlea Sensors", IEEE Transactions on Biomedical Circuits and Systems, vol. 10, No. 1, Feb. 2016, pp. 25-37.

Ted Smith et al., "A 15b Electromechanical Sigma-Delta Converter for Acceleration Measurements", Sensors and Display Electronics, Digest of Technical Papers, Feb. 17, 1994, pp. 160-161, ISSCC94, Session 9, Paper TA 9.4, IEEE.

Vladimir P. Petkov et al., "A Fourth-Order ΣΔ Interface for Micromachined Inertial Sensors", ISSCC 2004 / Session 17 / MEMS and Sensors / 17.6, Feb. 18, 2004.

Yunus Terzioglu et al., "A Capacitive MEMS Accelerometer Readout with Concurrent Detection and Feedback Using Discrete Components", 2014 IEEE/ION Position, Location and Navigation Symposium—PLANS 2014, May 5-8, 2014, pp. 12-15, IEEE, Monterey, CA, USA.

Zhenhua Ye et al., "High-Performance Closed-Loop Interface Circuit for High-Q Capacitive Microaccelerometers", IEEE Sensors Journal, vol. 13, No. 5, May 2013, pp. 1425-1433.

Zhichao Tan et al., "A 1.2V 8.3nJ Energy-Efficient CMOS Humidity Sensor for RFID Applications", 2012 Symposium on VLSI Circuits Digest of Technical Papers, Jun. 13-15, 2012, pp. 24-25, Honolulu, HI, USA.

\* cited by examiner

SEMICONDUCTOR DEVICE FOR READING AND OUTPUTTING SIGNAL FROM A SENSOR

CROSS-REFERENCE TO RELATED APPLICATIONS

This application is a continuation of and claims priority to PCT application No. PCT/KR2018/012615, filed on Oct. 24, 2018, which claims priority to Korean Patent Application No. 10-2017-0140492, filed on Oct. 26, 2017, which is incorporated herein by reference in its entirety.

BACKGROUND

1. Technical Field

Various embodiments generally relate to a semiconductor device for reading and outputting a signal from a sensor, and more particularly, to a semiconductor device for reading and outputting a signal from a sensor that outputs a signal having a small size in a low frequency band.

2. Related Art

With the advent of the Internet of Things (JOT), research and development is underway for various smart devices and sensors.

Most of the sensors used for this purpose have a characteristic of outputting a signal of a very small size in a low frequency of several hertz, therefore they are also referred to as DC sensors.

There is a need for a semiconductor device that outputs a high-resolution signal and consumes less power to read and output a signal from these sensors.

SUMMARY

In accordance with the present teachings, a semiconductor device may include a signal input circuit configured to select one of the plurality of sensor signals according to a channel selection signal; an amplifier circuit configured to amplify an output of the signal input circuit; and an analog-to-digital converter (ADC) configured to convert an output of the amplifier circuit into a digital value.

In accordance with the present teachings, a semiconductor device may include a signal input circuit configured to select one of the plurality of sensor signals according to a channel selection signal; an amplifier circuit configured to amplify an output of the signal input circuit; and an analog-to-digital converter (ADC) configured to convert an output of the amplifier circuit into a digital value, wherein each of the plurality of sensor signals is a differential signals and the signal input circuit changes polarity of an output signal thereof according to a first chopping signal, and wherein the ADC includes a delta-sigma modulator configured to generate a bit stream from an output of the amplifier circuit; an output chopping circuit configured to adjust phase of the bit stream according to the first chopping signal; and a filter configured to filter an output of the output chopping circuit and to output the digital value.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 1:
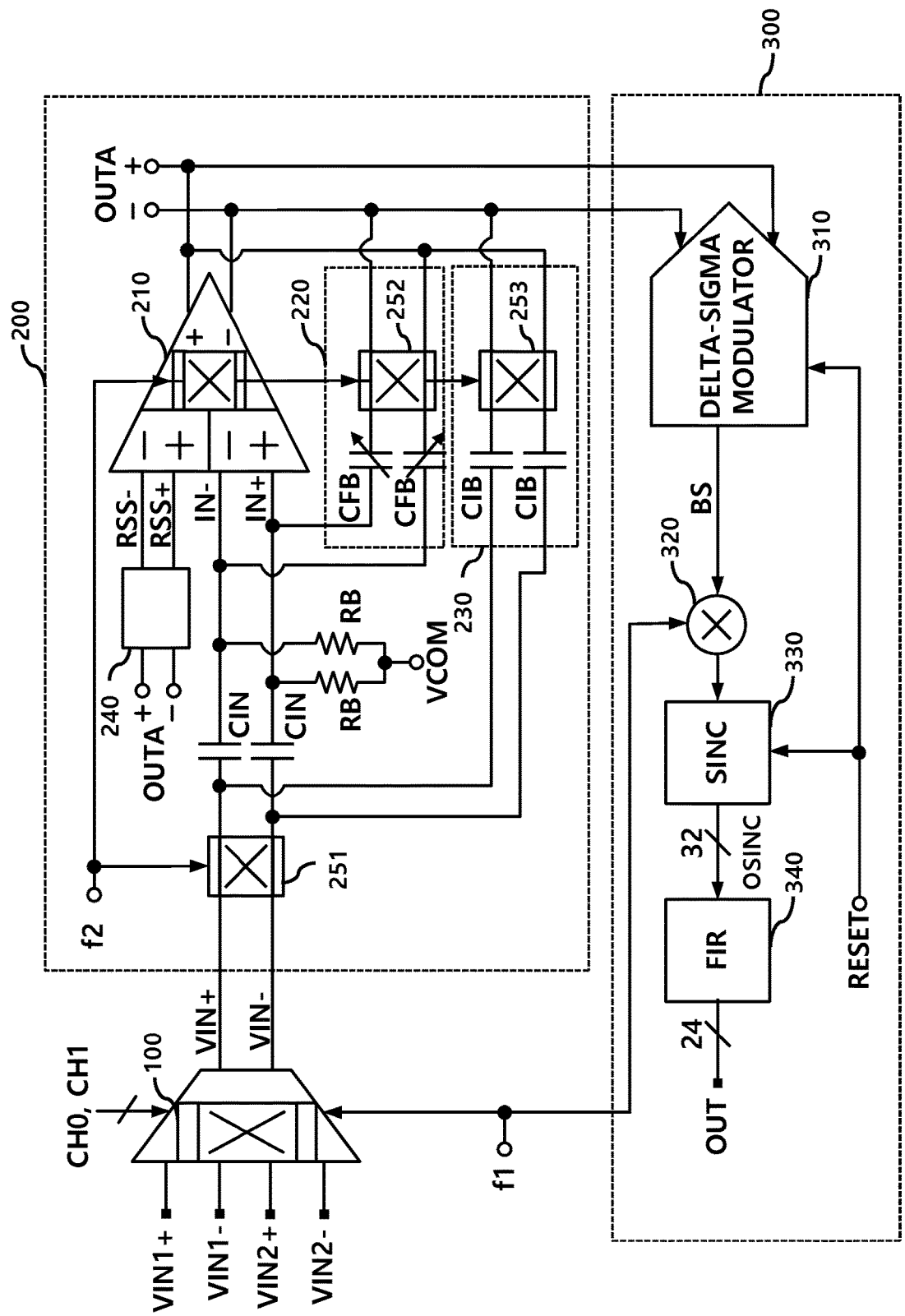
FIG. 1 is a block diagram illustrating a semiconductor device according to an embodiment of the present disclosure.

FIG. 1 is a block diagram illustrating a semiconductor device according to an embodiment of the present disclosure.

The semiconductor device includes a signal input circuit 100 for receiving a sensor signal and outputting an input signal, an amplifier circuit 200 for amplifying a signal output from the signal input circuit 100, and an analog-to-digital converter (ADC) 300 for converting an output signal of the amplifier circuit 200 into a digital signal.

The signal input circuit 100 selects a sensor signal among a plurality of sensor signals.

For example, the first sensor signal VIN1 is output from a first sensor (not shown), and the second sensor signal VIN2 is output from a second sensor (not shown). The first sensor signal VIN1 includes a pair of differential signals VIN1+ and VIN1− and the second sensor signals VIN2 includes a pair of differential signals VIN2+ and VIN2−.

The signal input circuit 100 selects the first sensor signals or the second sensor signals according to the channel selection signals CH0 and CH1 and outputs an input signal VIN. The input signal VIN includes a pair of differential signals VIN+ and VIN−.

The signal input circuit 100 performs a chopping operation according to a first chopping signal f1.

When the channel selection signals CH0 and CH1 are set to select the first sensor signal VIN1 from the first sensor, the input signal VIN and the first sensor signal VIN1 have the following relationship according to the first chopping signal f1.

TABLE 1

| f1 | VIN+ | VIN− |
|---|---|---|
| HIGH | VIN1+ | VIN1− |
| LOW | VIN1− | VIN1+ |

When the channel selection signals CH0 and CH1 are set to select the second sensor signal VIN2 from the second sensor, the input signal VIN and the second sensor signal VIN2 have the following relationship according to the first chopping signal f1.

TABLE 2

| f1 | VIN+ | VIN− |
|---|---|---|
| HIGH | VIN2+ | VIN2− |
| LOW | VIN2− | VIN2+ |

The amplifier circuit 200 includes an amplifier 210, a first feedback circuit 220, a second feedback circuit 230, a third feedback circuit 240, a first chopping circuit 251, a second chopping circuit 252, and a third chopping circuit 253.

The amplifier circuit 200 may further include bias resistors RB coupled between input terminals, and a common voltage VCOM may be applied to a common node between the bias resistors. The input terminals are differential therefore they may be represented as differential input terminals.

In this embodiment, as a bias resistor RB, a MOS transistor where a bias voltage is applied to a gate thereof may be used.

The amplifier circuit 200 includes input capacitors CIN coupled to the input terminals respectively. One of the two input capacitors may be represented as a first input capacitor and the other may be represented as a second input capacitor. For example, a first node of the first input capacitor is coupled to the first chopping circuit 251 and a second node of the first input capacitor is coupled to an input terminal of the amplifier 210.

The first to the third chopping circuits 251 to 253 are coupled to the input terminals or the output terminals of the amplifier circuit 200 respectively, and perform a chopping operation and a correlated double sampling (CDS) operation according to a second chopping signal f2. The output terminals are differential therefore they may be represented as differential output terminals.

At this time, a frequency of the second chopping signal f2 is greater than a frequency of the first chopping signal f1.

Since the chopping operation and the CDS operation are well-known techniques, detailed descriptions thereof will not be repeated.

The first chopping circuit 251 is coupled to the input terminals of the amplifier circuit 200 and each of the second and the third chopping circuits 252 and 252 is coupled to the output terminals of the amplifier circuit 200.

More specifically, the second chopping circuit 252 is coupled between the output terminals of the amplifier circuit 200 and feedback capacitors CFB, and the third chopping circuit 253 is coupled between the output terminals of the amplifier circuit 200 and impedance boosting capacitors CIB.

The amplifier 210 includes an amplifier chopping circuit 217 controlled by the second chopping signal f2.

The first feedback circuit 220 negatively feedbacks the output signal OUTA to the input terminals of the amplifier 210 through feedback capacitors CFB. One of the two feedback capacitors may be represented as a first feedback capacitor and the other may be represented as a second feedback capacitor. For example, a first node of the first feedback capacitor CFB is coupled to the second chopping circuit 252 and a second node of the first feedback capacitor CFB is coupled to an input terminal of the amplifier 210.

Accordingly, gain of the amplifier circuit 200 is determined by the capacitance ratio between the input capacitor CIN and the feedback capacitor, that is CIN/CFB.

The gain of the amplifier circuit 200 may be controlled by variably controlling the capacitance of the feedback capacitor CFB or the capacitance of the input capacitor CIN.

Thus, the gain of the amplifier circuit 200 according to the present embodiment is determined only by capacitive elements and is not affected by resistive elements.

In general, resistance is highly affected by process variation. Therefore, it is difficult to manufacture a semiconductor device that operates precisely when the gain of the amplifier circuit is controlled by the resistive elements.

On the other hand, in the present embodiment, since the gain of the amplifier circuit 200 is determined only by the ratio of capacitances, it is easy to implement a semiconductor device, and it is advantageous to ensure the linearity of the amplifier circuit 200.

The second feedback circuit 230 positively feedbacks the output signal OUTA to a first node of the input capacitor CIN through impedance boosting capacitors CIB. One of the two impedance boosting capacitors may be represented as a first impedance boosting capacitor and the other may be represented as a second impedance boosting capacitor. For example, a first node of the first impedance boosting capacitor is coupled to the third chopping circuit 253 and a second node of the first impedance boosting capacitor is coupled to the first node of the first input capacitor.

There is an effect of boosting input impedance by supplying input current required at the input terminal through the second feedback circuit 230.

Specifically, current input through the signal input circuit 100 may be reduced as much as current provided by the second feedback circuit 230, so that the impedance viewed from the input terminal of the amplifier circuit 200 may be increased.

The third feedback circuit 240 feedbacks the output signal OUTA and outputs a ripple suppression signal RSS. The output signal OUTA includes a pair of differential signals OUTA+ and OUTA− and the ripple suppression signal RSS includes a pair of differential signals RSS+ and RSS−.

The ripple suppression signal RSS is input to the amplifier 210 so that the amplifier 210 may suppress ripples generated due to the chopping operation at the output terminal thereof using the ripple suppression signal RSS.

In another embodiment, the third feedback circuit 240 may be omitted. Instead, a low-pass filter (not shown) may be added to the output terminal of the amplifier 210 to suppress ripples existing at the output signal of the amplifier 210. The low-pass filter may be implemented at a separate device.

The amplifier 210 performs a differential amplification according to the input signal IN and the ripple suppression signal RSS to generate the output signal OUTA. For example, the amplifier 210 amplifies sum of a first difference between the input signals and a second difference between the ripple suppression signals.

In this embodiment, the ADC 300 uses an incremental analog-to-digital conversion technique.

In this embodiment, the ADC 300 includes a delta-sigma modulator 310, an output chopping circuit 320, and filters 330 and 340.

In this embodiment, only capacitive components are present at the input terminal of the delta-sigma modulator 310 but a resistive load is not coupled to the amplifier 210.

The output chopping circuit 320 adjusts a phase of a bit stream BS output from the delta-sigma modulator 310 according to the first chopping signal f1.

In this embodiment, the output chopping circuit 320 may be implemented digitally.

For example, when the first chopping signal f1 is at a high level, the output chopping circuit 320 outputs the bit stream BS without changing phase thereof and when the first chopping signal f1 is at a low level, the output chopping circuit 320 outputs the bit stream BS with phase thereof inverted.

In the embodiment, the filter includes a sinc filter 330 and a finite impulse response (FIR) filter 340.

The reset signal RESET is a pulse signal that is periodically activated in consideration of analog-to-digital conversion time at the ADC 300.

The reset signal RESET may be generated by using a circuit that outputs a pulse signal, where the circuit counts a clock signal and generates the pulse signal when the circuit counts a predetermined value.

The signal input circuit 100 and the output chopping circuit 320 perform a chopping operation according to the first chopping signal f1.

Accordingly, the ADC 300 generates data considering an output when the first chopping signal f1 is at the high level as well as an output when the first chopping signal f1 is at the low level.

Figure 2:
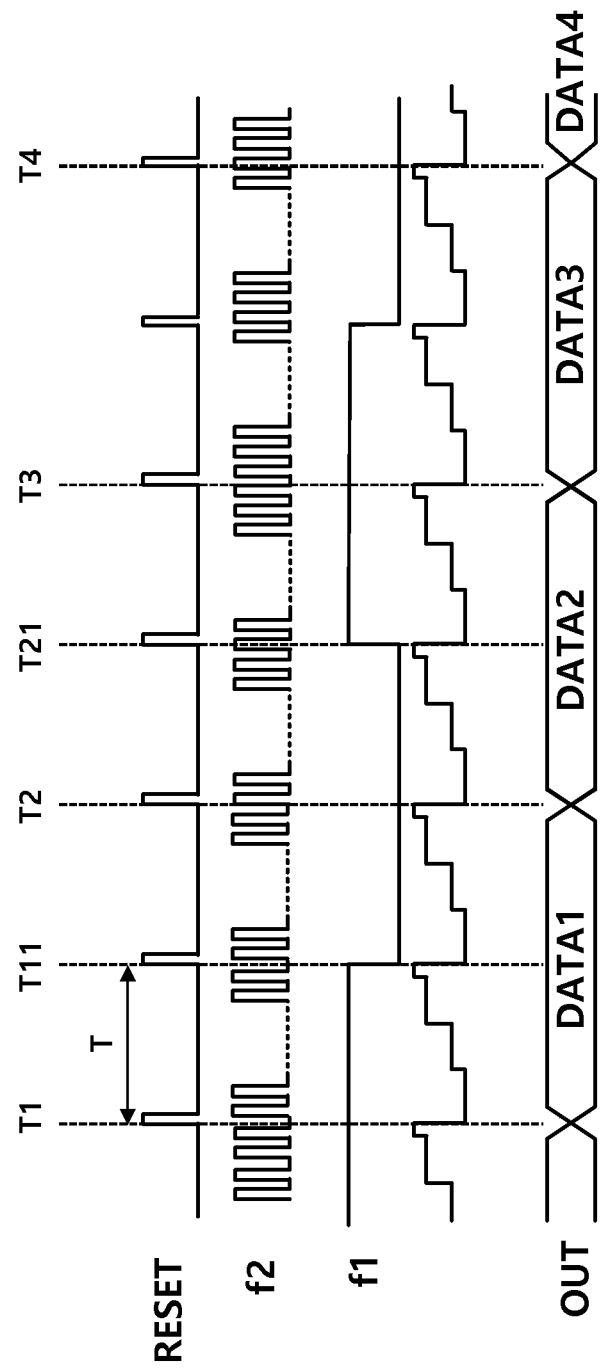
FIG. 2 is a timing diagram illustrating an operation of a semiconductor device according to an embodiment of the present disclosure.

FIG. 2 is a timing diagram illustrating an operation of a semiconductor device according to an embodiment of the present disclosure.

The first chopping signal f1 has a longer period than that of the second chopping signal f2.

The period of the first chopping signal f1 is related to the operating time T of the delta-sigma modulator 310 required for digital conversion.

In the present embodiment, the period of the first chopping signal f1 is set to be twice the operating time T.

Also, the period of the reset signal RESET is set to be equal to the operation time T, and an edge of the reset signal RESET is aligned with an edge of the first chopping signal f1.

The outputs of the sinc filter 330 and the delta-sigma modulator 310 are reset by the reset signal RESET.

The delta-sigma modulator 310 performs a modulation operation for an analog-to-digital conversion in intervals between T1 to T11, T11 to T2, T2 to T21, and T21 to T3, respectively, according to the chopping operation of the signal input circuit 100 and the output chopping circuit 320.

The output chopping circuit 320 chops and outputs the bit stream BS output from the delta-sigma modulator 310 according to the first chopping signal f1.

The sinc filter 330 performs a sinc filtering on the output of the output chopping circuit 320 and outputs a signal OSINC.

In this embodiment, the FIR filter 340 is an averaging filter.

For example, the digital value DATA3 output from the FIR filter 340 at T3 may be a value obtained by calculating a moving average of last four signals OSINC output from the sinc filter 330 at T11, T2, T21, and T3.

As described above, when the FIR filter 340 outputs a digital value OUT in a moving average method, the waiting time can be reduced, and accordingly, a decrease in the data rate can be minimized.

As described above, in the present embodiment, since the chopping operation is performed in the amplifier circuit 200 and also the chopping operation is performed in the signal input circuit 100 and the output chopping circuit 320, better effect in reducing flicker noise and DC offset is achieved.

Figure 3:
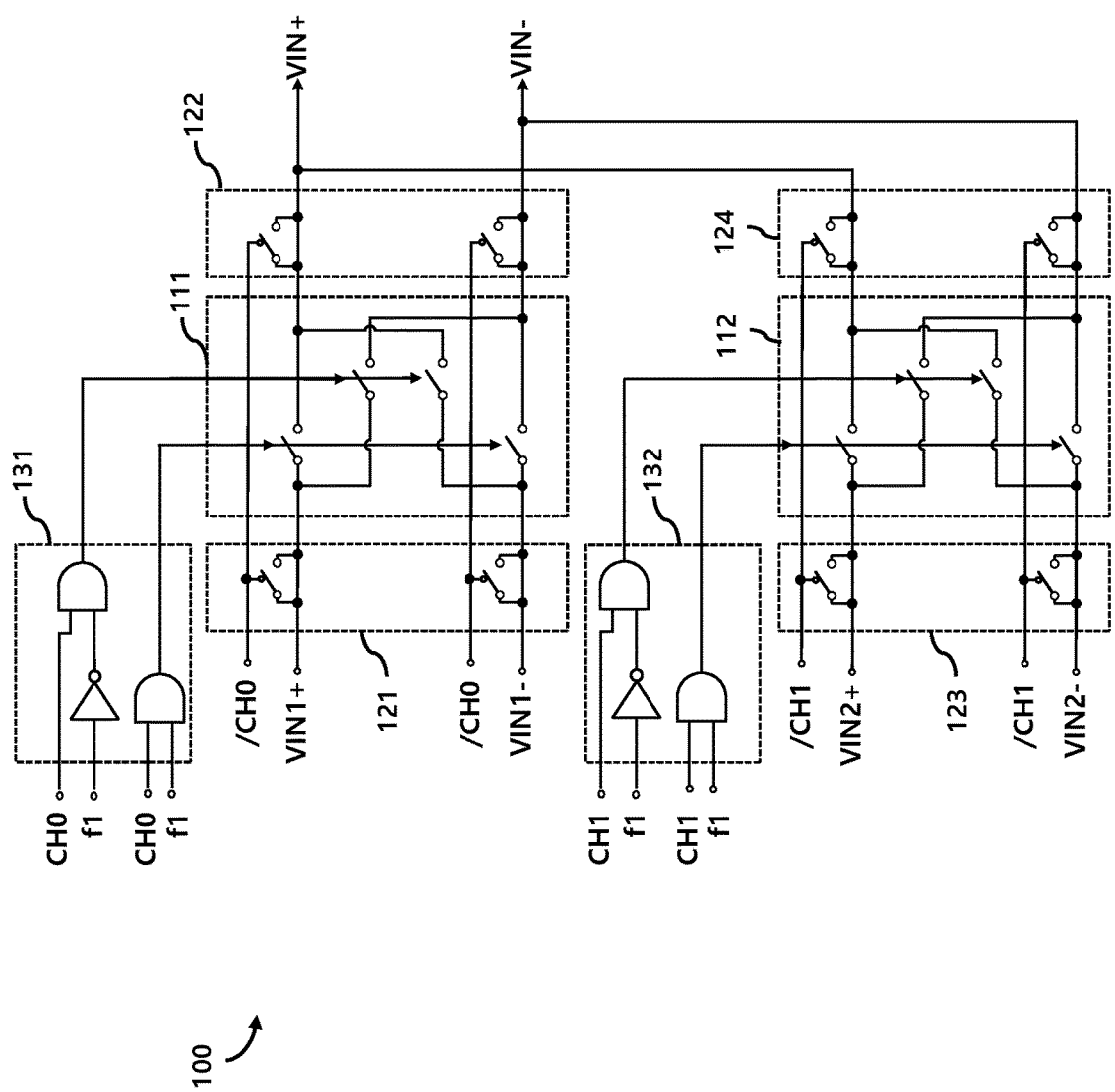
FIG. 3 is a circuit diagram illustrating a signal input circuit according to an embodiment of the present disclosure.

FIG. 3 is a circuit diagram illustrating a signal input circuit 100 according to an embodiment of the present disclosure.

As described above, in the present embodiment, the signal input circuit 100 selects the first sensor signals VIN1 or the second sensor signal VIN2 according to the channel selection signals CH0 and CH1.

Also, in each case, a sensor signal including a pair of differential sensor signals selected by the channel selection signals CH0 and CH1 is output with or without polarities of the pair of differential sensor signals being changed according to the level of the first chopping signal f1.

In this embodiment, the signal input circuit 100 includes chopping switches 111 and 112, dummy switches 121 to 124, and chopping switch controllers 131 and 132.

In this embodiment, the chopping switches 111 and 112 are designed to perform a chopping operation as well as a multiplexing operation for selecting a sensor signal, thereby reducing an increase in noise.

The chopping switch controller 131 controls the chopping switch 111 according to the channel selection signal CH0 and the first chopping signal f1 to perform the multiplexing operation and the chopping operation together.

The chopping switch controller 132 controls the chopping switch 112 according to the channel selection signal CH1 and the first chopping signal f1 to perform the multiplexing operation and the chopping operation together.

Since the chopping operation and the multiplexing operation have been described above, description thereof is not repeated.

The dummy switches 121 and 122 are turned on or turned off according to the channel selection signal CH0, and connected before and after the chopping switch 111, and the dummy switches 123 and 124 are turned on or turned off according to the channel selection signal CH1, and connected before and after the chopping switch 112.

When the chopping switches 111 and 112 are turned or turned off, electric charges are generated, which may cause nonlinearity of the entire circuit.

Therefore, it is preferable that the dummy switches 121 and 122 is switched complementarily to the chopping switches 111 in order to cancel the charge generated in the switching operation of the chopping switch 111 and the dummy switches 123 and 124 is switched complementarily to the chopping switches 112 in order to cancel the charge generated in the switching operation of the chopping switch 112.

For example, when the chopping switch 111 is implemented with NMOS transistors, the dummy switches 121 and 122 may be implemented with PMOS transistors, or when the chopping switch 111 is implemented with PMOS transistors, the dummy switches 121 and 122 may be implemented with NMOS transistors.

As shown in FIG. 2, the switching time of the chopping switches 111 and 112, that is, the edge of the first chopping signal f1 is aligned with the reset signal RESET. Therefore, at least a part of the semiconductor device may be reset by the reset signal RESET at the switching time of the chopping switches 111 and 112 and thus influence of switching noise may be further reduced.

Figure 4:
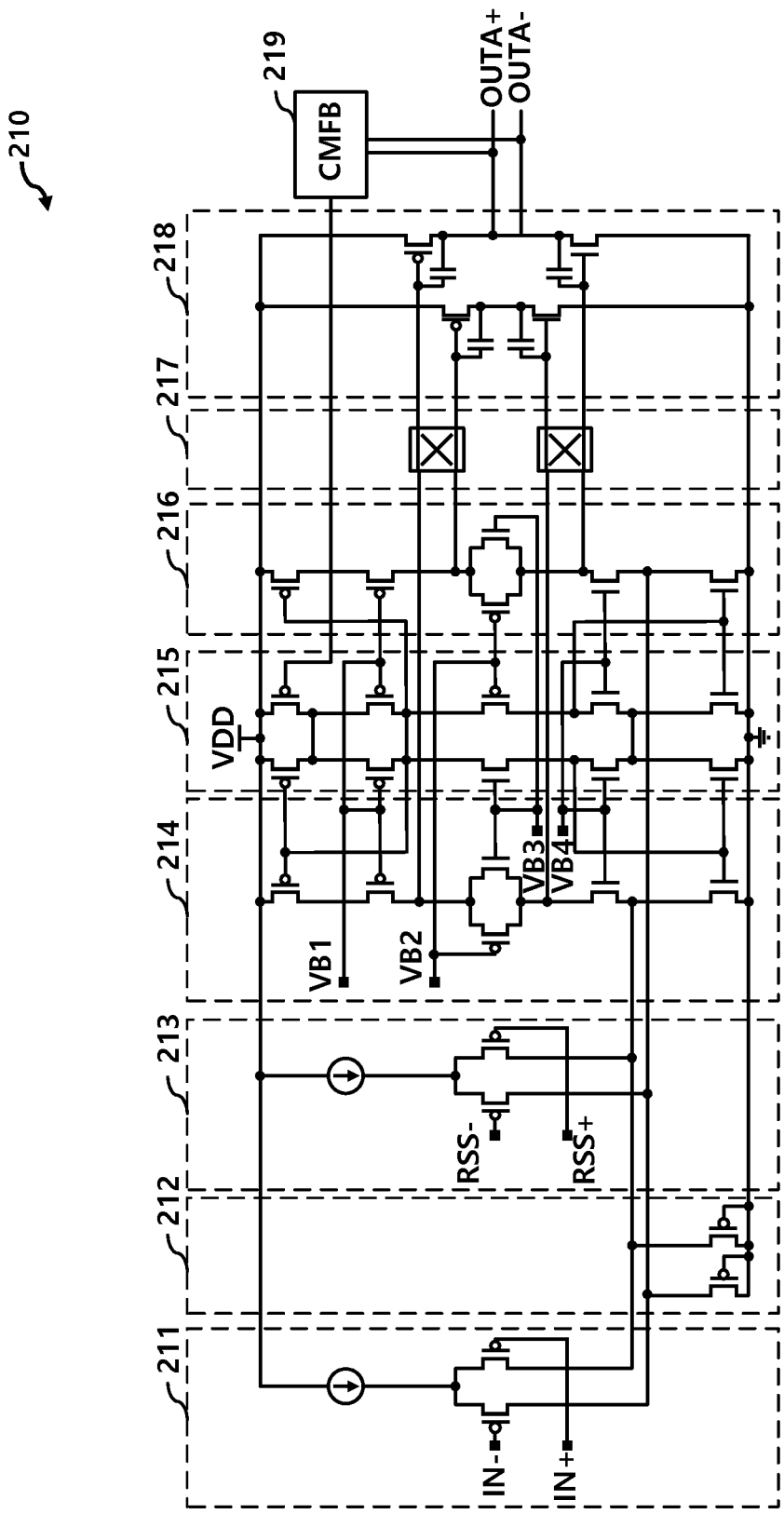
FIG. 4 is a circuit diagram illustrating an amplifier according to an embodiment of the present disclosure.

FIG. 4 is a circuit diagram illustrating an amplifier 210 according to an embodiment of the present disclosure.

The amplifier 210 includes a main signal input circuit 211 receiving the input signal IN, a clamp circuit 212, a ripple suppression signal input circuit 213 receiving the ripple suppression signal RSS, a gain and bias adjustment stages 214 and 216 controlled by bias control voltages VB1 to VB4, a common mode control stage 215, the amplifier chopping circuit 217, a Class-AB output stage 218 outputting the output signal OUTA, and a common mode feedback (CMFB) circuit 219.

The amplifier chopping circuit 217 performs a chopping operation according to the second chopping signal f2.

As shown in FIG. 4, the amplifier 210 does not use a resistive load, and accordingly, is less susceptible to process variation.

The circuit diagram shown in FIG. 4 is constructed by combining well-known circuit elements, and a detailed description of the circuit elements included in the circuit diagram and the operation of the circuit elements will not be repeated.

Figure 5:
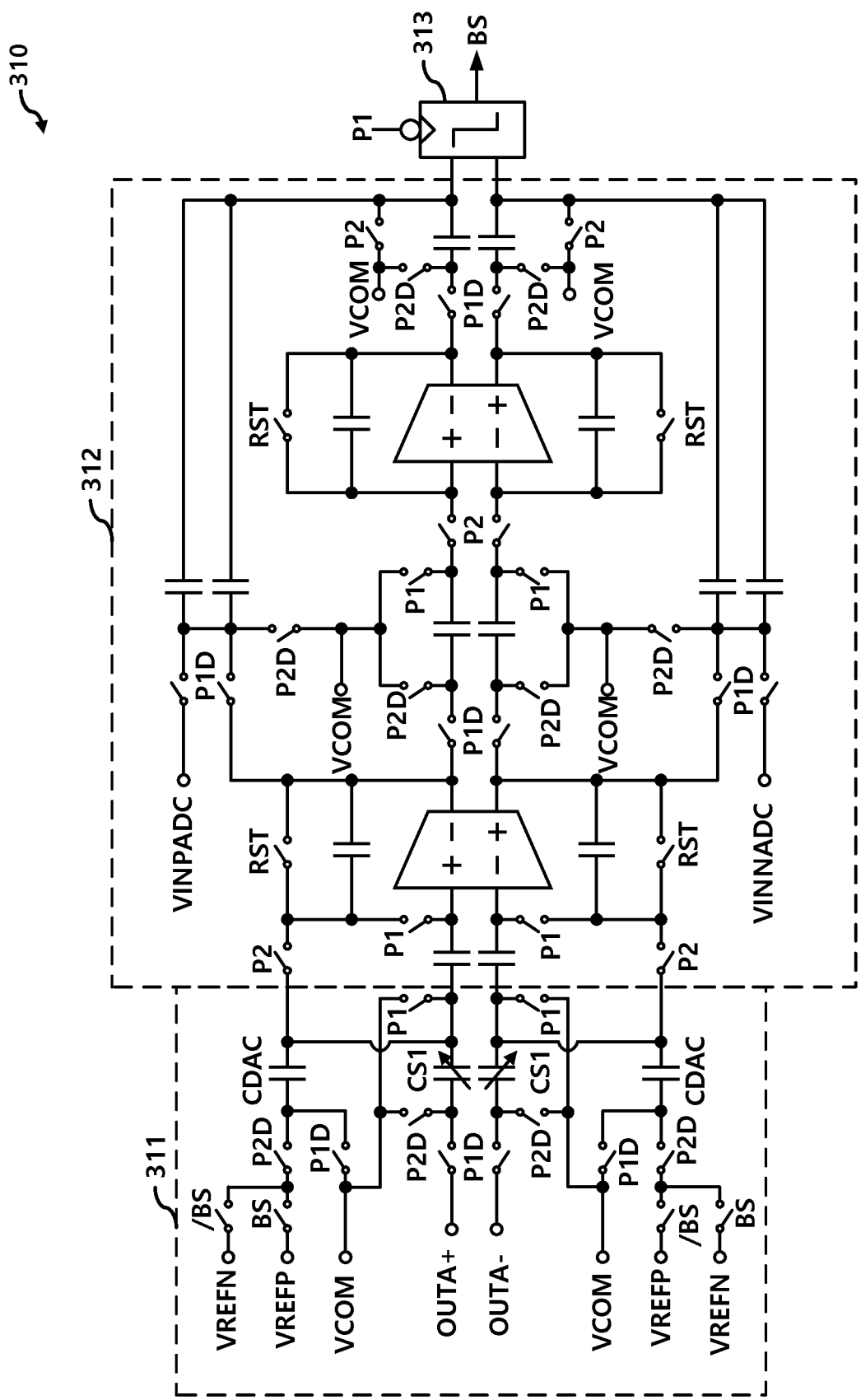
FIG. 5 is a circuit diagram illustrating a delta-sigma modulator according to an embodiment of the present disclosure.
Figure 6:
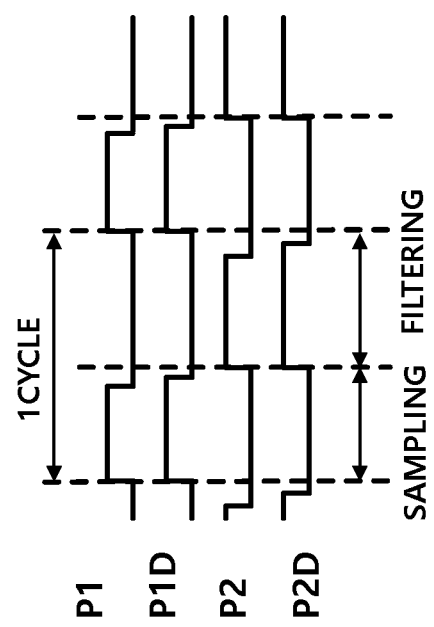
FIG. 6 is a timing diagram illustrating an operation of a delta-sigma modulator according to an embodiment of the present disclosure.

FIG. 5 is a circuit diagram illustrating a delta-sigma modulator 310 according to an embodiment of the present disclosure and FIG. 6 is a timing diagram illustrating an operation of the delta-sigma modulator 310.

In this embodiment, the delta-sigma modulator 310 is a second order 1-bit delta-sigma modulator and includes a sampling circuit 311, an integrating filter 312, and a comparator 313.

In this embodiment, the sampling circuit 311 includes capacitors but does not include a resistive element.

Accordingly, the sampling circuit 311 does not apply any resistive load to the output terminal of the amplifier 210 of FIG. 3.

Since the delta-sigma modulator 310 also does not include a resistive element, process reliability can be improved, which is advantageous for implementing the entire semiconductor device in a chip.

The circuits in FIG. 5 are example of delta-sigma modulator 310 meeting such a requirement of the embodiment. Because the circuits in FIG. 5 and timing diagram in FIG. 6 are well-known, detailed description thereof are not repeated.

In this embodiment, the sampling circuit 311 includes a first capacitor CS1 which samples the output signal OUTA of the amplifier circuit 200 and a second capacitor CDAC which samples an analog signal VREFP or VREFN corresponding to the bit stream BS output from a comparator 313. The analog signals VREFP and VREFN are predetermined reference voltage and average voltage thereof is represented as VCOM.

Accordingly, the ADC 300 has a gain determined by the capacitance ratio of the first capacitor CS1 and the second capacitor CDAC, that is, CS1/CDAC.

The gain of the ADC 300 may be controlled by adjusting the capacitance of the first capacitor CS1 or the second capacitor CDAC.

In another embodiment, the capacitance of the first capacitor CS1 or the second capacitor CDAC may be controlled according to a bit stream BS output from the delta-sigma modulator 310 or a digital value OUT output from the ADC 300.

For example, when it is determined that the sensor signal is small by observing the bit stream BS or the digital value OUT, the capacitance of the first capacitor CS1 and the second capacitor CDAC can be adjusted in the direction of increasing the gain, and when it is determined that the sensor signal is large by observing the bit stream BS or the digital value OUT, the capacitance of the first capacitor and the second capacitor may be adjusted in a direction of reducing the gain.

This control operation may be performed in a separate capacitance control circuit (not shown), which may be implemented by a hardware, a software, or a combination thereof.

In another embodiment, the capacitance control circuit may control gain of amplifier circuit 200 instead of gain of the delta-sigma modulator 310 or control gain of the amplifier circuit 200 as well as gain of the delta-sigma modulator 310.

In order to control gain of the amplifier circuit 200, the capacitance of the input capacitor CIN or the feedback capacitor CFB may be controlled as described above.

In the above-described embodiments, a technique for controlling capacitance of a capacitor according to a control signal is well-known to those skilled in the art, and thus, a detailed description or detailed circuit diagram thereof are omitted.

Since the semiconductor device according to the present embodiment can control the gain in the amplifier 200 and the gain of the ADC 300, the total gain can be determined by a combination of these.

Figure 7:
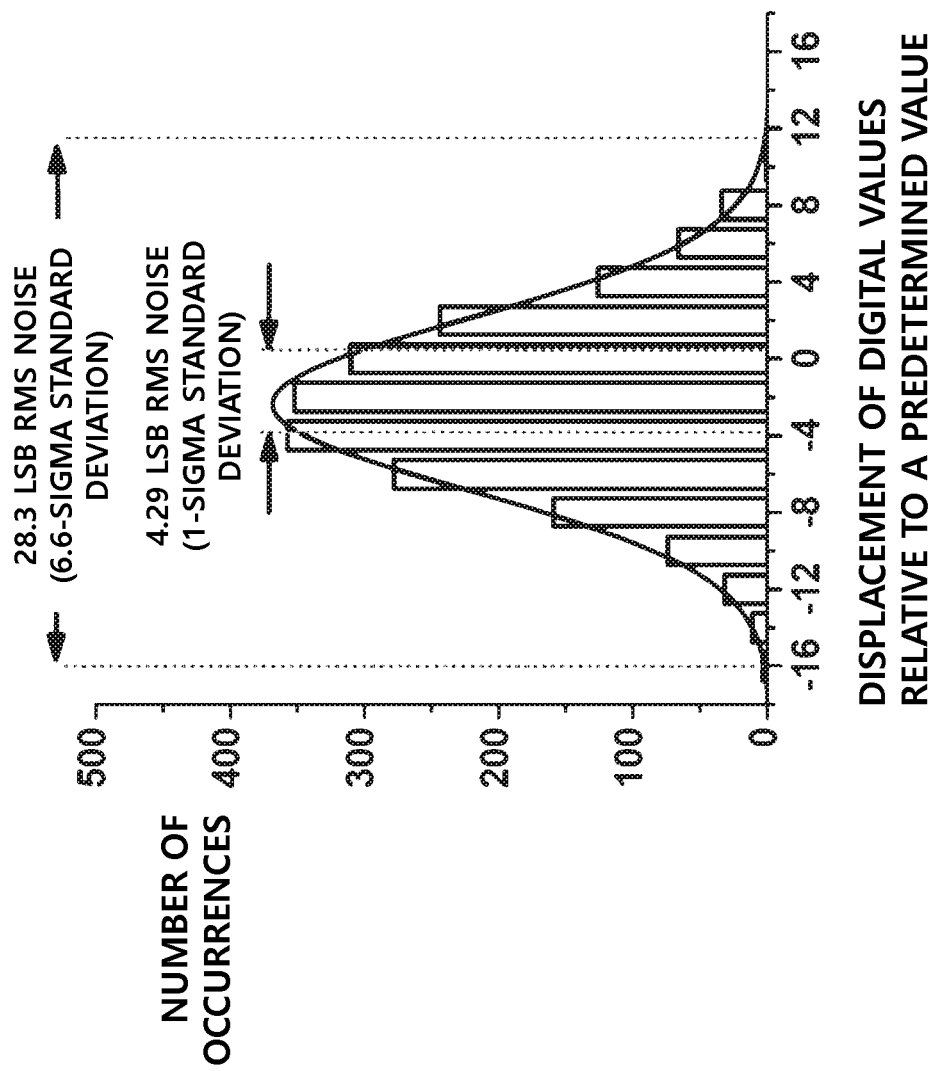
FIGS. 7 and 8 are graphs illustrating effects of a semiconductor device according to an embodiment of the present disclosure.
Figure 8:
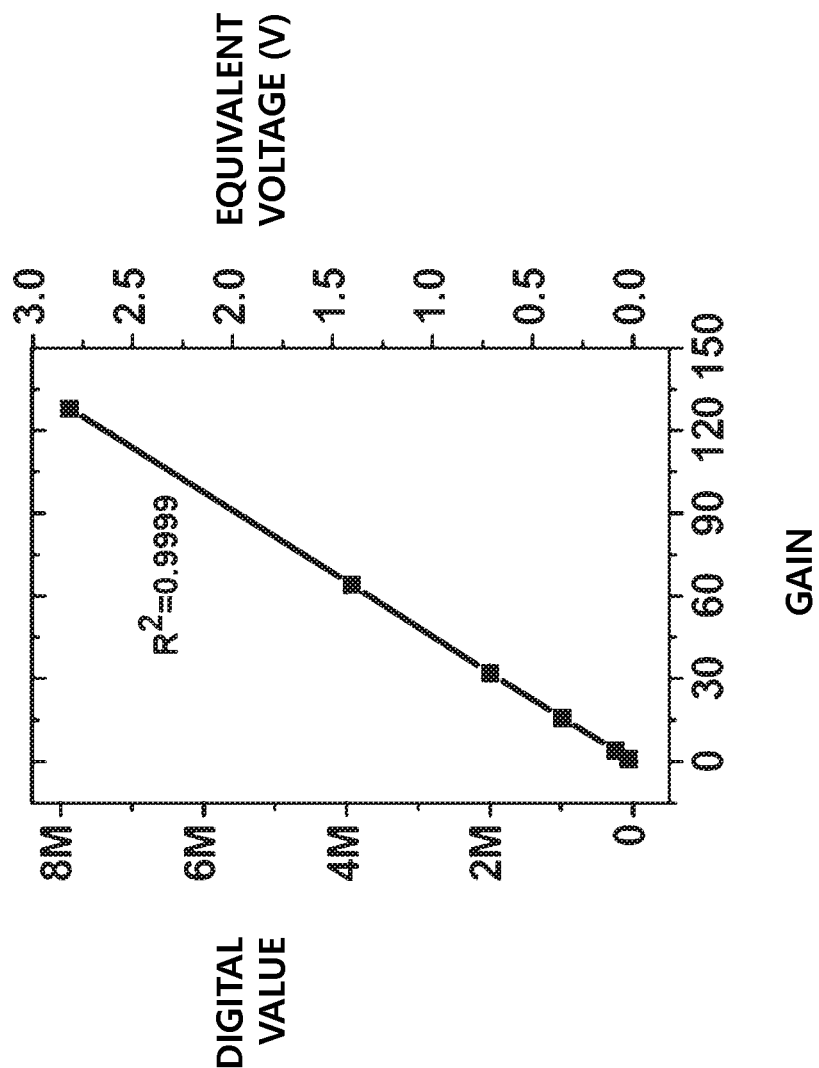

FIGS. 7 and 8 are graphs illustrating effects of a semiconductor device according to an embodiment of the present disclosure.

The graph of FIG. 7 shows a result of measuring noise of a semiconductor device according to the present embodiment.

In the graph of FIG. 7, the horizontal axis represents displacement of the digital value relative to a predetermined value, and the vertical axis represents number of occurrences of the corresponding displacement.

The graph shows 4.29 LSB RMS noise characteristics based on the 1-sigma standard deviation, which means that only 4.29 out of $2^{24}$ digital outputs are affected by noise based on the 24-bit ADC used in the experiment. The graph also shows 28.3 LSB RMS noise characteristics.

Through this, it can be seen that the semiconductor device according to the present embodiment well suppresses flicker noise or noise due to DC offset.

In the graph of FIG. 8, the horizontal axis represents gain of the semiconductor device, the left vertical axis represents digital value output from the semiconductor device, and the right vertical axis represents the analog voltage corresponding to the digital value.

Through the graph of FIG. 8, it can be seen that the digital value changes linearly with the gain.

In the graph, $R^2$ is an index indicating the degree of linearity, where it is more linear when $R^2$ is closer to 1

As shown in the graph, the value of $R^2$ measured in the embodiment is 0.9999, which represents very good linearity of the semiconductor device of the present embodiment.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A semiconductor device comprising:
   a signal input circuit configured to select one of a plurality of sensor signals according to a channel selection signal;
   an amplifier circuit configured to amplify an output of the signal input circuit; and an analog-to-digital converter (ADC) configured to convert an output of the amplifier circuit into a digital value, wherein each of the plurality of sensor signals is a differential signal and the signal input circuit changes polarity of an output signal thereof according to a first chopping signal, wherein the ADC includes:
a delta-sigma modulator configured to generate a bit stream from an output of the amplifier circuit;
an output chopping circuit configured to adjust phase of the bit stream according to the first chopping signal; and
a filter configured to filter an output of the output chopping circuit and to output the digital value.

2. The semiconductor device of claim 1, wherein the signal input circuit includes:
a chopping switch;
a chopping switch controller configured to control the chopping switch according to the channel selection signal and the first chopping signal; and
a dummy switch controlled by the channel selection switch and coupled to the chopping switch.

3. The semiconductor device of claim 2, wherein the chopping switch includes a first switch element and the dummy switch includes a second switch element, wherein the first switch element and the second switch element are switched complementarily.

4. The semiconductor device of claim 1, wherein the amplifier circuit includes:
an input capacitor;
an amplifier including an input terminal coupled to a first node of the input capacitor, and an output terminal, and configured to amplify a signal provided at the input terminal and to provide an amplified signal at the output terminal; and
a first feedback circuit including a feedback capacitor and configured to negatively feedback the amplified signal to the input terminal,
wherein a gain of the amplifier circuit is determined by capacitance ratio of the input capacitor and the feedback capacitor.

5. The semiconductor device of claim 4, wherein the input terminal includes differential input terminals and the output terminal includes differential output terminals,
wherein the input capacitor includes a first input capacitor and a second input capacitor coupled to the differential input terminals respectively,
wherein the feedback capacitor includes a first feedback capacitor and a second feedback capacitor coupled to the differential input terminals respectively,
wherein the amplifier circuit further comprises a first chopping circuit configured to change connecting paths between the signal input circuit and the first input capacitor and the second input capacitor according to the second chopping signal and a second chopping circuit to change connecting paths between the differential output terminals and the first feedback capacitor and the second feedback capacitor according to the second chopping signal, and wherein the amplifier changes polarity of signals therein provided to the differential output terminals according to the second chopping signal.

6. The semiconductor device of claim 5, wherein the amplifier circuit includes a second feedback circuit that positively feedbacks an output of the amplifier to a second node of the input capacitor through an impedance boosting capacitor,
wherein the impedance boosting capacitor includes a first impedance boosting capacitor coupled to the first input capacitor and a second impedance boosting capacitor coupled to the second input capacitor, and
wherein the amplifier circuit further comprises a third chopping circuit configured to change coupling paths between the differential output terminals and the first impedance boosting capacitor and the second impedance boosting capacitor.

7. The semiconductor device of claim 4, wherein the amplifier circuit further includes a third feedback circuit configured to generate a ripple suppression signal from an output of the amplifier, and the amplifier is configured to perform an amplification operation with the ripple suppression signal and a signal provided at the input terminal.

8. The semiconductor device of claim 1, wherein a period of the first chopping signal is greater than time required to perform an analog-to-digital conversion operation at the ADC.

9. The semiconductor device of claim 1, wherein the delta-sigma modulator is configured to be reset according to a reset signal enabled every half-period of the first chopping signal and an edge of the reset signal is aligned with an edge of the first chopping signal.

10. The semiconductor device of claim 1, wherein the filter includes a sinc filter filtering an output of the output chopping circuit and a finite impulse response (FIR) filter filtering an output of the sinc filter and providing the digital value.

11. The semiconductor device of claim 10, wherein the FIR filter generates the digital value by calculating a moving average of values output from the sinc filter.

12. The semiconductor device of claim 1, wherein the delta-sigma modulator includes a first capacitor for sampling an output of the amplifier circuit and a second capacitor for sampling an analog value corresponding to the bit stream, and wherein gain of the ADC is determined by a ratio of capacitances of the first capacitor and the second capacitor.

13. The semiconductor device of claim 12, wherein the delta-sigma modulator further includes an integrating filter for integrating an output of the sampling circuit and a comparator for generating the bit stream from an output of the integrating filter.

14. The semiconductor device of claim 12, wherein capacitance of the first capacitor or capacitance of the second capacitor is controlled according to the bit stream or the digital value.

15. The semiconductor device of claim 14, wherein gain of the amplifier circuit is controlled according to the bit stream or the digital value.

* * * * *